United States Patent
Zhang et al.

(10) Patent No.: US 9,337,868 B2
(45) Date of Patent: May 10, 2016

(54) ITERATIVE DECODING FOR CASCADED LDPC AND TCM CODING

(71) Applicants: NEC Laboratories America, Inc., Princeton, NJ (US); NEC Corporation, Tokyo (JP)

(72) Inventors: Shaoliang Zhang, Plainsboro, NJ (US); Fatih Yaman, Monmouth Junction, NJ (US); Yoshihisa Inada, Tokyo (JP); Takaaki Ogata, Tokyo (JP); Takanori Inoue, Tokyo (JP)

(73) Assignee: NEC Corporation (JP)

( * ) Notice: Subject to any disclaimer, the term of this patent is extended or adjusted under 35 U.S.C. 154(b) by 29 days.

(21) Appl. No.: 14/336,074

(22) Filed: Jul. 21, 2014

(65) Prior Publication Data

US 2015/0026541 A1    Jan. 22, 2015

Related U.S. Application Data

(60) Provisional application No. 61/856,834, filed on Jul. 22, 2013.

(51) Int. Cl.
| | | |
|---|---|---|
| *H03M 13/00* | (2006.01) | |
| *H03M 13/11* | (2006.01) | |
| *H04L 1/00* | (2006.01) | |
| *H03M 13/25* | (2006.01) | |
| *H03M 13/29* | (2006.01) | |
| *H03M 13/41* | (2006.01) | |

(52) U.S. Cl.
CPC ........ *H03M 13/1111* (2013.01); *H03M 13/256* (2013.01); *H03M 13/2957* (2013.01); *H03M 13/4138* (2013.01); *H04L 1/0076* (2013.01)

(58) Field of Classification Search
CPC .......... H03M 13/1111; H03M 13/256; H03M 13/2957; H03M 13/4138; H03M 13/617
USPC .......................................................... 714/776
See application file for complete search history.

(56) References Cited

U.S. PATENT DOCUMENTS

| | | | | |
|---|---|---|---|---|
| 8,793,551 | B2 | 7/2014 | Zhou et al. | |
| 2006/0236197 | A1* | 10/2006 | Lin | H03M 13/256 714/758 |
| 2006/0251164 | A1* | 11/2006 | Visoz | H04L 1/005 375/233 |
| 2007/0226599 | A1* | 9/2007 | Motwani | G11B 20/10009 714/792 |
| 2009/0193313 | A1* | 7/2009 | Kong | H03M 13/6561 714/755 |
| 2013/0230119 | A1* | 9/2013 | Dhakal | H04B 7/0456 375/295 |
| 2014/0310580 | A1* | 10/2014 | Zhang | H03M 13/1111 714/780 |

OTHER PUBLICATIONS

Hagenauer, Joachim, and Peter Hoeher. "A Viterbi algorithm with soft-decision outputs and its applications." Global Telecommunications Conference, 1989, and Exhibition. Communications Technology for the 1990s and Beyond. GLOBECOM'89., IEEE. IEEE, 1989.

* cited by examiner

*Primary Examiner* — David Ton
(74) *Attorney, Agent, or Firm* — Joseph Kolodka

(57) ABSTRACT

At a receiver side, to enhance the performance of concatenated LDPC and TCM coding, an iterative decoding between TCM decoder and LDPC decoder enables improvement in the reliability of received LLRs of each symbol after each iteration. A SOVA output of the TCM is used for LDPC decoding, and then the updated LLRs from LDPC decoder are further looped back to the TCM decoder for the next iteration. In such a manner, the decoding performance could be significantly improved after just several iterations.

10 Claims, 2 Drawing Sheets

ITERATIVE DECODING FOR CASCADED LDPC AND TCM CODING

RELATED APPLICATION INFORMATION

This application claims priority to provisional application No. 61/856,834 filed Jul. 22, 2013, entitled "Iterative Decoding For cascaded LDPC and TCM Coding Scheme, the contents thereof are incorporated herein by reference

BACKGROUND OF THE INVENTION

The present invention relates generally to decoding, and more particularly, to iterative decoding for cascaded low-density parity-check LDPC and trellis-coded modulation TCM coding.

Since coherent optical communication has moved from 100 Gb/s to 400 Gb/s, and even higher using higher-order QAM format, the requirement for high OSNR dramatically shorten the transmission reach. In order to keep the transmission reach within an acceptable distance, coded modulation is one of the promising techniques which could improve the receiver sensitivity by more than 3 dB in sacrificing the spectral efficiency. As a result, the transmission distance is still able to achieve ultra-long-haul distance. The issue with coded modulation is how to integrate with high-coding-gain low-density parity check codes (LDPC) for achieving better error correction performance. This invention record is to propose the concatenation of LDPC and trellis coded modulation (TCM) with iterative decoding feature, to provide high net coding gain (NCG).

The following references discuss prior efforts in the decoding:

[1] Zhou, Wei, et al. "SERIAL CONCATENATION OF TRELLISCODED MODULATION AND AN INNER NON-BINARY LDPC CODE." U.S. patent application Ser. No. 12/737,107.

[2] Lin, Chien-Ching, and Chen-Yi Lee. "Transmission method combining trellis coded modulation and low-density parity check code and architecture thereof." U.S. patent application Ser. No. 11/225,081.

[3] Hagenauer, Joachim, and Peter Hoeher. "A Viterbi algorithm with soft-decision outputs and its applications." Global Telecommunications Conference, 1989, and Exhibition. Communications Technology for the 1990s and Beyond. GLOBECOM'89., IEEE. IEEE, 1989.

In [1], the authors proposed to use TCM as outer codes and non-binary LDPC for inner code. The output of inner LDPC decoder could enhance the performance of TCM with better log-likelihood ratios (LLRs). However, the improvement of the concatenation between non-binary LDPC and TCM is very limited due to the regular LDPC and TCM decoding. The patent did not address the potential bursts errors introduced by the channel. Further, the presence of non-binary LDPC encoder limits the flexibility of this scheme for different transmission systems.

On the other hand, TCM has been used as the inner codes for correcting the errors before being fed into the LDPC decoder in [2]. This approach utilizes the soft-output Viterbi algorithm (SOVA) to decode the TCM encoded symbols, and the output of SOVA can be further used for calculating the LLRs for the following LDPC decoder. However, the performance is also limited by the single concatenation of TCM decoder and LDPC decoder.

Accordingly, there is a need for iterative decoding for cascaded low-density parity-check LDPC and trellis-coded modulation TCM coding that overcomes problems with prior efforts.

BRIEF SUMMARY OF THE INVENTION

The invention is directed a method for iterative decoding of a communications signal that includes decoding an input signal using a soft output Viterbi algorithm, the input signal being a concatenated low-density parity-check LDPC and TCM coded signal; de-interleaving output symbols from the prior decoding for making errors in the decoding evenly distributed and statistically independent for improving error correction performance of subsequent LDPC decoding; LDPC decoding output from the prior de-interleaving, the decoding being initialized with Log-likelihood ratios LLRs output from the initial decoding; employing a soft quadrature amplitude modulator symbol estimator on output from the de-interleaving for providing a likelihood of recovered symbols which can be used for further TCM decoding; and ineterleaving the output from the soft QAM estimating for putting estimated symbols back into an original position before sending it back to the initial decoding if needed; wherein with the soft-QAM symbol estimating and converged LLRs from the initial decoding, the TCM decoder is enabled to achieve increased symbol detection with accurate LLRs in the next iteration.

In a similar aspect of the invention there is provided a non-transitory storage medium configured with instructions to be implemented by a computer for carrying out decoding of an input signal using a soft output Viterbi algorithm, the input signal being a concatenated low-density parity-check LDPC and TCM coded signal; de-interleaving output symbols from the prior decoding for making errors in the decoding evenly distributed and statistically independent for improving error correction performance of subsequent LDPC decoding; LDPC decoding output from the prior de-interleaving, the decoding being initialized with Log-likelihood ratios LLRs output from the initial decoding; employing a soft quadrature amplitude modulator symbol estimator on output from the de-interleaving for providing a likelihood of recovered symbols which can be used for further TCM decoding; and ineterleaving the output from the soft QAM estimating for putting estimated symbols back into an original position before sending it back to the initial decoding if needed; wherein with the soft-QAM symbol estimating and converged LLRs from the initial decoding, the TCM decoder is enabled to achieve increased symbol detection with accurate LLRs in the next iteration.

These and other advantages of the invention will be apparent to those of ordinary skill in the art by reference to the following detailed description and the accompanying drawings.

DETAILED DESCRIPTION

The present invention is directed to a method where the TCM is used as an inner code for increasing the system flexibility. The outer LDPC codes can be either binary or non-binary depending on the system requirement. After an LDPC encoder, an interleaver has been inserted to combat the potential burst errors. Most importantly, at the receiver side, to enhance the performance of concatenated LDPC and TCM coding, the iterative decoding between TCM decoder and LDPC decoder has been proposed for keeping improving the reliability of the received LLRs of each symbol after each iteration. The SOVA output of TCM is used for the LDPC decoding, and then the updated LLRs from LDPC decoder will be further looped back to the TCM decoder for the next iteration. In such a manner, the decoding performance could be significantly improved after just several iterations.

A cascaded forward error-correction FEC adjusts the data rate by changing the re-encoded data size M. Enlarging M increases the FEC overhead and lowers the code rate. With re-encoding the FEC error-correction capability is improved as enhanced LLRs can be utilized by neighboring codewords to perform decoding. The original decoding of cascaded FEC utilized the overlapped enhanced LLRs in a sequential way, i.e., decoding a subsequent codeword uses enhanced LLRs from its proceeding codeword. In this invention, we explore the decoding in both the forward and backward way, which forms cyclic decoding of cascaded FEC.

Figure 1:
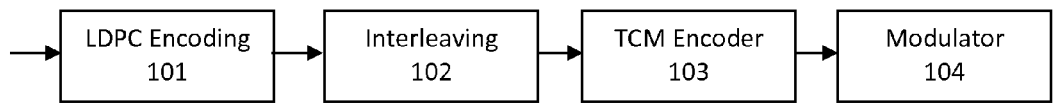
FIG. 1 is a diagram depicting a transmitter employing LDPC and TCM encoding.

Referring to the LDPC and TCM transmitter shown in FIG. 1, at block 101, the LDPC encoder takes in the client data to perform either binary or non-binary LDPC encoding for channel error correction in the system.

At the point of block 102, the interleaving function is inserted between LDPC encoding (Block 101) and TCM encoder (Block 103) to introduce deep bit/symbol interleaving, thus enhancing the tolerance to the possible burst errors in the channel.

Then at block 103, the TCM encoder carries out the set-partitioning in the specified modulation formats depending on the user's request.

The outputs, at block 104, of the TCM encoder are converted into optical signals through a modulator.

Figure 2:
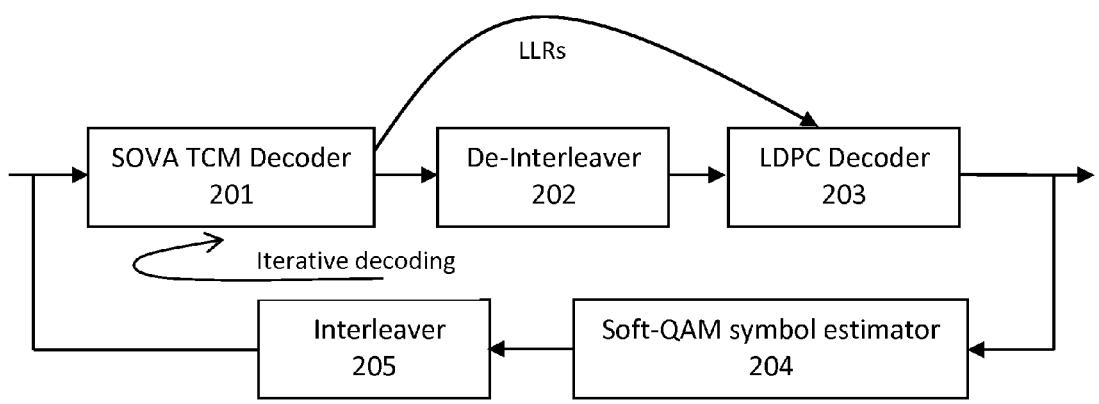
FIG. 2 is a flow chart for iterative decoding, in accordance with the invention.

Referring now to the inventive iterative decoding receiver, shown in FIG. 2,

The demodulated symbols are fed into TCM decoder for performing soft output Viterbi Algorithm SOVA. Other than the estimated symbols corresponding to the transmitted ones, the soft-decision $$LLR\Lambda_k = \log \frac{p(\hat{u}_k | y)}{1 - p(\hat{u}_k | y)}$$

can also be obtained through the methods presented in [3]. Block 201.

The output symbols/bits of SOVA in the TCM decoder are de-interleaved for making the errors are evenly distributed and statistically independent, thereby improving the error correction performance of LDPC decoder. Block 202

The LDPC decoder is initialized with the LLRs output from SOVA in the TCM decoder. The conventional sum product algorithm (SPA) could be used for decode the LDPC codewords with multiple iterations. The converged bit LLRs in the LDPC decoder have been looped back to the soft-QAM symbol estimator, and are used for next-iteration TCM and LDPC decoding. Block 203.

The soft-QAM symbol estimator is aiming to deliver the likelihood of the recovered symbols, which can be used for the TCM decoder for further decoding. The soft-QAM symbol estimator calculates the probability of the each symbol based on the log 0likelihood ratios LLRs outputs from the LDPC decoder using the subsequent equations [4]:

$$\hat{x}_{qam} = \sum_{n=1}^{N} s_n P(x_{qam} = s_n) = \sum_{n=1}^{N} s_n \prod_{i=1}^{c} P(b_i = s_{n,i})$$

where $$P(b_i = 0) = \frac{1}{e^{-\lambda_i} + 1}; P(b_i = 1) = \frac{1}{e^{\lambda_i} + 1},$$

$\lambda_i$ is the LLRs of the bit $b_i$, $s_n$ is the QAM symbol with N constellation points, and $(s_{n,1}, s_{n,2}, \ldots, S_{n,C})$ stands for the bit mapping of the N-QAM. Here $c = \log_2 N$ represents c bits per symbol. With the help of the soft-QAM symbol estimator and the converged LLRs from LDPC decoder, the TCM decoder could achieve a better symbol detection with much accurate LLRs in the next iterations. The number of iterations is expected to be less than 3 to obtain sufficient coding gain in the proposed cascaded approach.

The de-interleaver puts the estimated symbols from soft-QAM symbol estimator back into original position before sending it back to TCM encoder. Block 205.

Figure 3:
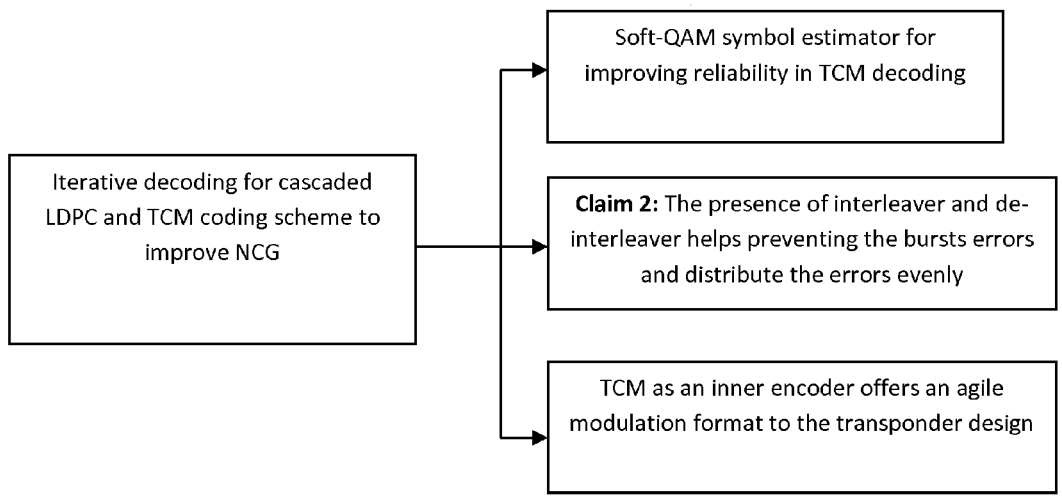
FIG. 3 is a diagram showing main aspects of the iterative decoding, in accordance with the invention.
Figure 4:
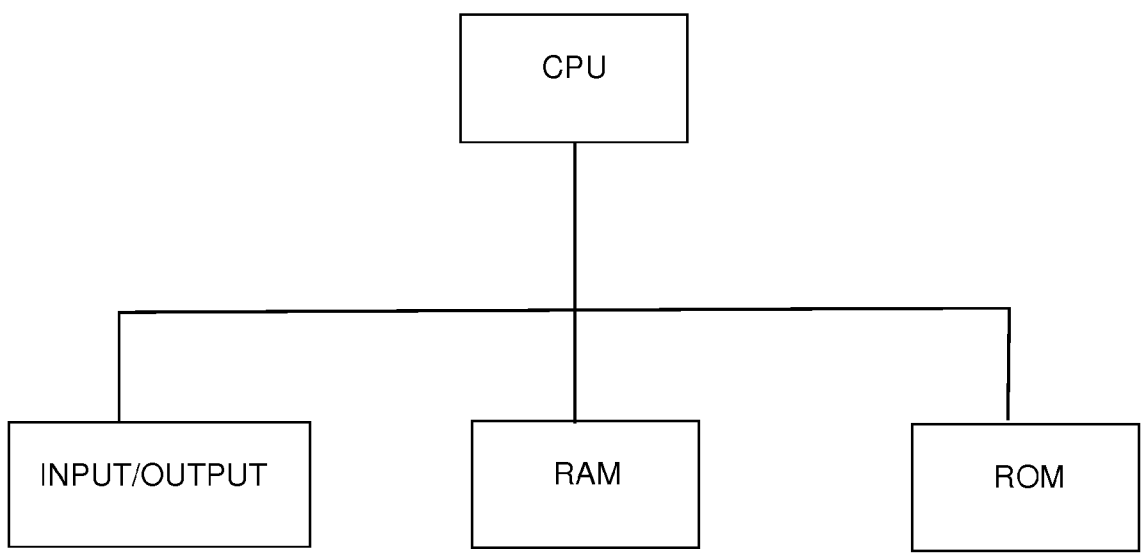
FIG. 4 shows an exemplary computer to perform the inventive cyclic decoding of cascaded FEC codes.

Referring to FIG. 3, key aspects of the inventive iterative decoding for cascaded LDPC and TCM coding which improves net coding gain NCG includes a soft-QAM (quadrature amplitude modulation) symbol estimation for improving reliability in TCM decoding, an interleaving and deinterleaving to help prevent bursts errors and distribute the errors evenly, and inner TCM encoding which offers an agile modulation format for a transponder design.

The invention may be implemented in hardware, firmware or software, or a combination of the three. Preferably the invention is implemented in a computer program executed on a programmable computer having a processor, a data storage system, volatile and non-volatile memory and/or storage elements, at least one input device and at least one output device. More details are discussed in U.S. Pat. No. 8,380,557, the content of which is incorporated by reference.

By way of example, a block diagram of a computer to support the system is discussed next in FIG. 3. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

From the foregoing, it can be appreciated that the present invention provides the competitive value of iterative decoding among TCM decoder and LDPC decoder would enhance the coding correction performance overall. The presence of TCM could also fully re-utilize the existing hardware platform (100G transponder) without modifying the hardware and optics, thus reducing the cost for re-designing new transponder. The LDPC code could be either binary or non-binary, thus making our scheme more generic to flexible system design. The TCM decoder could make the transition of "water-fall" of LDPC coding correction faster, thus achieving higher coding gain. Meanwhile, at the "water-fall" regime of the TCM coding performance, the number of iterations in the LDPC decoder could be significantly reduced to have less complexity. The presence of IL would help to mitigate the burst errors caused by the channels.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

The invention claimed is:

1. A method for iterative decoding of a communications signal comprising the steps of:
    i) decoding an input signal using a soft output Viterbi algorithm, the input signal being a concatenated low-density parity-check LDPC and TCM coded signal;
    ii) de-interleaving output symbols from step i) for making errors in the decoding evenly distributed and statistically independent for improving error correction performance of subsequent LDPC decoding;
    iii) LDPC decoding output from step ii), the decoding being initialized with Log-likelihood ratios LLRs output from step i);
    iv) employing a soft quadrature amplitude modulator symbol estimator on output from step iii) for providing a likelihood of recovered symbols which can be used for further TCM decoding; and
    v) ineterleaving the output from step iv) for putting estimated symbols back into an original position before sending it back to step i) if needed;
    wherein with the soft-QAM symbol estimating of iv) and converged LLRs from the step i) decoding, the TCM decoder is enabled to achieve increased symbol detection with accurate LLRs in the next iteration.

2. The method of claim 1, wherein sufficient coding gain is achievable with less than or equal to 3 iterations of steps i)-v).

3. The method of claim 1, wherein step iii) comprises using a sum product algorithm (SPA) that could be used for decoding the LDPC codewords with multiple iterations.

4. The method of claim 1, wherein step iii) comprises converged bit LLRs in the LDPC decoding to have been looped back to the soft-QAM symbol estimator and used for next-iteration TCM and LDPC decoding.

5. The method of claim 1, wherein the soft-QAM symbol estimating calculates a probability of the each symbol based on the LLRs outputs from the LDPC decoder using $$\hat{x}_{qam} = \sum_{n=1}^{N} s_n P(x_{qam} = s_n) = \sum_{n=1}^{N} s_n \prod_{i=1}^{c} P(b_i = s_{n,i})$$

where $$P(b_i = 0) = \frac{1}{e^{-\lambda_i} + 1}; P(b_i = 1) = \frac{1}{e^{\lambda_i} + 1},$$

$\lambda_i$ is the LLRs of the bit $b_i$, $s_n$ is the QAM symbol with N constellation points, and $(s_{n,1}, s_{n,2}, \ldots)$ stands for the bit mapping of the N-QAM, $c=\log_2 N$ representing c bits per symbol.

6. A non-transitory storage medium configured with instructions to be implemented by a computer for carrying out the following steps:
    i) decoding an input signal using a soft output Viterbi algorithm, the input signal being a concatenated low-density parity-check LDPC and TCM coded signal;
    ii) de-interleaving output symbols from step i) for making errors in the decoding evenly distributed and statistically independent for improving error correction performance of subsequent LDPC decoding;
    iii) LDPC decoding output from step ii), the decoding being initialized with Log-likelihood ratios LLRs output from step i);
    iv) employing a soft quadrature amplitude modulator symbol estimator on output from step iii) for providing a likelihood of recovered symbols which can be used for further TCM decoding; and
    v) ineterleaving the output from step iv) for putting estimated symbols back into an original position before sending it back to step i) if needed;
    wherein the soft-QAM symbol estimating of iv) and converged LLRs from the step i) decoding, the TCM decoder is enabled to achieve increased symbol detection with increased accurate LLRs in the next iteration.

7. The non-transitory storage medium of claim 6, wherein sufficient coding gain is achievable with less than or equal to 3 iterations of steps i)-v).

8. The non-transitory storage medium of claim 6, wherein step iii) comprises using a sum product algorithm (SPA) that could be used for decoding the LDPC codewords with multiple iterations.

9. The non-transitory storage medium of claim 6, wherein step iii) comprises converged bit LLRs in the LDPC decoding to have been looped back to the soft-QAM symbol estimator and used for next-iteration TCM and LDPC decoding.

10. The non-transitory storage medium of claim 6, wherein the soft-QAM symbol estimating calculates a probability of the each symbol based on the LLRs outputs from the LDPC decoder using $$\hat{x}_{qam} = \sum_{n=1}^{N} s_n P(x_{qam} = s_n) = \sum_{n=1}^{N} s_n \prod_{i=1}^{c} P(b_i = s_{n,i})$$

where $$P(b_i = 0) = \frac{1}{e^{-\lambda_i} + 1}; P(b_i = 1) = \frac{1}{e^{\lambda_i} + 1},$$

$\lambda_i$ is the LLRs of the bit $b_i$, $s_n$ is the QAM symbol with N constellation points, and $(s_{n,1}, s_{n,2}, \ldots)$ stands for the bit mapping of the N-QAM, $c=\log_2 N$ representing c bits per symbol.

\* \* \* \* \*